US010398052B2

(12) United States Patent
Ehlen

(10) Patent No.: US 10,398,052 B2
(45) Date of Patent: Aug. 27, 2019

(54) SELF-CONTAINED CIRCUIT BOARD ACTUATOR

(71) Applicant: Facebook, Inc., Menlo Park, CA (US)

(72) Inventor: Jon Brian Ehlen, Newark, CA (US)

(73) Assignee: Facebook, Inc., Menlo Parks, CA (US)

( * ) Notice: Subject to any disclaimer, the term of this patent is extended or adjusted under 35 U.S.C. 154(b) by 217 days.

(21) Appl. No.: 15/286,241

(22) Filed: Oct. 5, 2016

(65) Prior Publication Data
US 2018/0095505 A1   Apr. 5, 2018

(51) Int. Cl.
*H05K 7/14*   (2006.01)

(52) U.S. Cl.
CPC ......... *H05K 7/1485* (2013.01); *H05K 7/1409* (2013.01)

(58) Field of Classification Search
CPC .......................... G06F 1/183; H01R 12/7058
See application file for complete search history.

(56) References Cited

U.S. PATENT DOCUMENTS

| | | |
|---|---|---|
| 3,853,379 A | 12/1974 | Goodman et al. |
| 4,256,356 A | 3/1981 | Roth et al. |
| 5,302,133 A | 4/1994 | Tondreault |
| 5,848,906 A | 12/1998 | Glusker et al. |
| 6,625,035 B1 | 9/2003 | Steinman et al. |
| 7,057,904 B2 * | 6/2006 | Bundza ............... H04Q 1/02 361/727 |
| 7,114,984 B2 * | 10/2006 | Shirk ............... H01R 13/627 439/372 |
| 9,538,683 B2 * | 1/2017 | Ehlen ............... H05K 7/1409 |
| 9,960,562 B2 * | 5/2018 | Chu ............... H01R 43/205 |
| 2001/0043432 A1 | 11/2001 | Hamatsu et al. |
| 2016/0261083 A1 | 9/2016 | Chu et al. |
| 2016/0381824 A1 | 12/2016 | Chu |
| 2018/0095505 A1 * | 4/2018 | Ehlen ............... H01R 12/7058 |
| 2018/0145472 A1 * | 5/2018 | Chu ............... H01R 43/205 |

OTHER PUBLICATIONS

Notice of Allowance dated Dec. 29, 2017 for U.S. Appl. No. 14/704,166 of Chu, R., et al., filed May 5, 2015.
U.S. Appl. No. 14/704,166 of Chu, R., filed May 5, 2015.
Non-Final Office Action dated Jun. 15, 2017 for U.S. Appl. No. 14/704,166 of Chu, R., et al., filed May 5, 2015.
Restriction Requirement dated Mar. 14, 2017 for U.S. Appl. No. 14/704,166 of Chu, R., et al., filed May 5, 2015.

* cited by examiner

*Primary Examiner* — Minh N Trinh
(74) *Attorney, Agent, or Firm* — FisherBroyles, LLP

(57) ABSTRACT

A self-contained circuit board actuator including a pivot bearing connectable to a circuit board and an actuator lever pivotably coupled to the pivot bearing. The lever is moveable between a closed position and an open position. A pair of opposed pawls extend from a first end of the lever and a latch notch is formed in the first end adjacent the pair of opposed pawls. The latch notch engages a catch tab on the pivot bearing when the lever is in the closed position. The lever is coupled to the pivot bearing by a pivot member and the lever is slidable along the pivot member between a latched position and an unlatched position. The lever includes a pivot bore to receive the pivot member and a resilient member is positioned in the pivot bore around the pivot member to urge the lever toward the latched position.

7 Claims, 6 Drawing Sheets

SELF-CONTAINED CIRCUIT BOARD ACTUATOR

TECHNICAL FIELD

This patent application is directed to data storage server configurations and, more specifically, to circuit board actuator systems.

BACKGROUND

It is normally difficult to move a circuit board into or out of its connector by hand. A circuit board ejector is often used to provide mechanical advantage for the ejection or insertion of a circuit board into its connector. Conventional circuit board ejectors are functional; however, they typically only either eject or insert a circuit board into its corresponding connector. In addition, conventional ejectors often lack features for retaining the ejectors in a closed position. Furthermore, conventional circuit board ejectors are typically large mechanisms that take up circuit board area. Therefore, there is need for compact circuit board actuator systems that can eject and insert a circuit board into and out of its connector, as well as provide features for retaining the ejectors in a closed position.

BRIEF DESCRIPTION OF THE DRAWINGS

The self-contained circuit board actuator introduced herein may be better understood by referring to the following Detailed Description in conjunction with the accompanying drawings, in which like reference numerals indicate identical or functionally similar elements.

Figure 1:
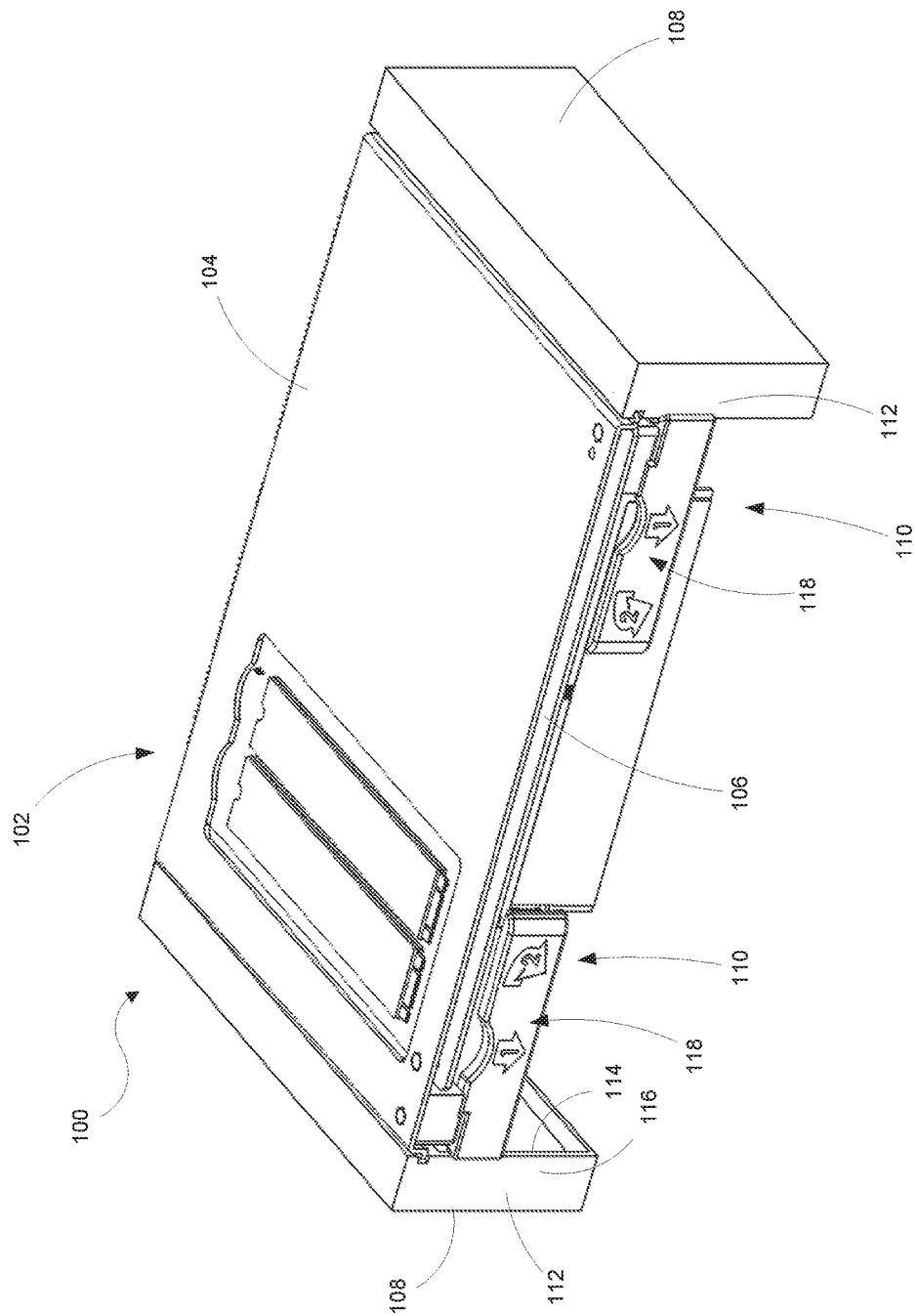
FIG. 1 is an isometric view of a memory drive assembly including self-contained circuit board actuators according to a representative embodiment positioned in a pair of circuit board guides.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to limit the embodiments described. On the contrary, the embodiments are intended to cover all modifications, equivalents, and alternatives falling within the scope of the embodiments as defined by the appended claims.

DETAILED DESCRIPTION

Overview

A self-contained circuit board actuator and actuator system are disclosed for ejecting and inserting a circuit board into a circuit board connector. In an embodiment, the self-contained circuit board actuator includes a pivot bearing connectable to a circuit board and an actuator lever pivotably coupled to the pivot bearing. The pivot bearing includes a mounting surface and a bearing surface opposite the mounting surface. A catch tab extends from the bearing surface. The actuator lever is pivotably coupled to the pivot bearing adjacent the bearing surface and is moveable between a closed position and an open position. The actuator lever includes an arm extending between a first end portion and a second end portion. A pair of opposed pawls extend from the first end portion of the arm and a latch notch is formed in the first end portion adjacent the pair of opposed pawls. The latch notch is configured to engage the catch tab on the pivot bearing when the lever is in the closed position.

The lever is pivotally coupled to the pivot bearing by a fastener and the lever is also slidable along the fastener between a latched position and an unlatched position. The first end portion of the arm includes a pivot bore adapted to receive the fastener and a resilient member is positioned in the pivot bore around the fastener to urge the lever toward the latched position. Thus, the latch mechanism is contained between the pivot bearing and actuator lever providing a compact self-contained circuit board actuator.

In an embodiment, a circuit board actuator system having self-contained actuators includes a circuit board with a pair of pivot bearings connected to the circuit board. A pair of levers are pivotably coupled to corresponding pivot bearings and are moveable between a closed position and an open position. The pair of levers each include an arm, an insertion pawl extending from a first end portion of the arm, an ejector pawl opposite the insertion pawl, and a latch notch formed in the end portion adjacent the ejector pawl and configured to engage a catch tab on the pivot bearing when the lever is in the closed position. The system includes a pair of circuit board guides each including a keeper portion and mountable adjacent a circuit board connector, wherein the insertion pawls each operate against a first surface of the keeper portions to insert the circuit board into the circuit board connector when the pair of levers are moved toward the closed position, and the ejector pawls each operate against a second surface of the keeper portions to eject the circuit board from the circuit board connector when the pair of levers are moved toward the open position.

The levers cooperate with the pawls to provide a mechanical advantage for inserting and ejecting the circuit board into and out of its connector. This mechanical advantage reduces the amount of force a user must apply to insert or eject the circuit board. The actuator system also applies the force evenly across the circuit board. Accordingly, the actuator system reduces the potential to bend or otherwise stress the circuit board during insertion and ejection.

General Description

Various examples of the devices introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

FIG. 1 illustrates a circuit board actuator system 100 according to a representative embodiment. The circuit board actuator system 100 includes a pair of self-contained circuit board actuators 110 mounted to a circuit board assembly 102. In an embodiment, the circuit board assembly 102 can include a card chassis 104 supporting a printed circuit board 106. The circuit board assembly 102 can be a server module or a memory module, for example. The circuit board assembly 102 is supported in a pair of card guides 108, each including a keeper portion 112 having first and second sides 114 and 116, respectively. The card guides 108 are mountable adjacent a circuit board connector (not shown). Each circuit board actuator 110 includes an actuator lever 118 configured to engage a corresponding keeper portion 112 for ejecting and inserting the circuit board assembly 102 into the circuit board connector.

Figure 2:
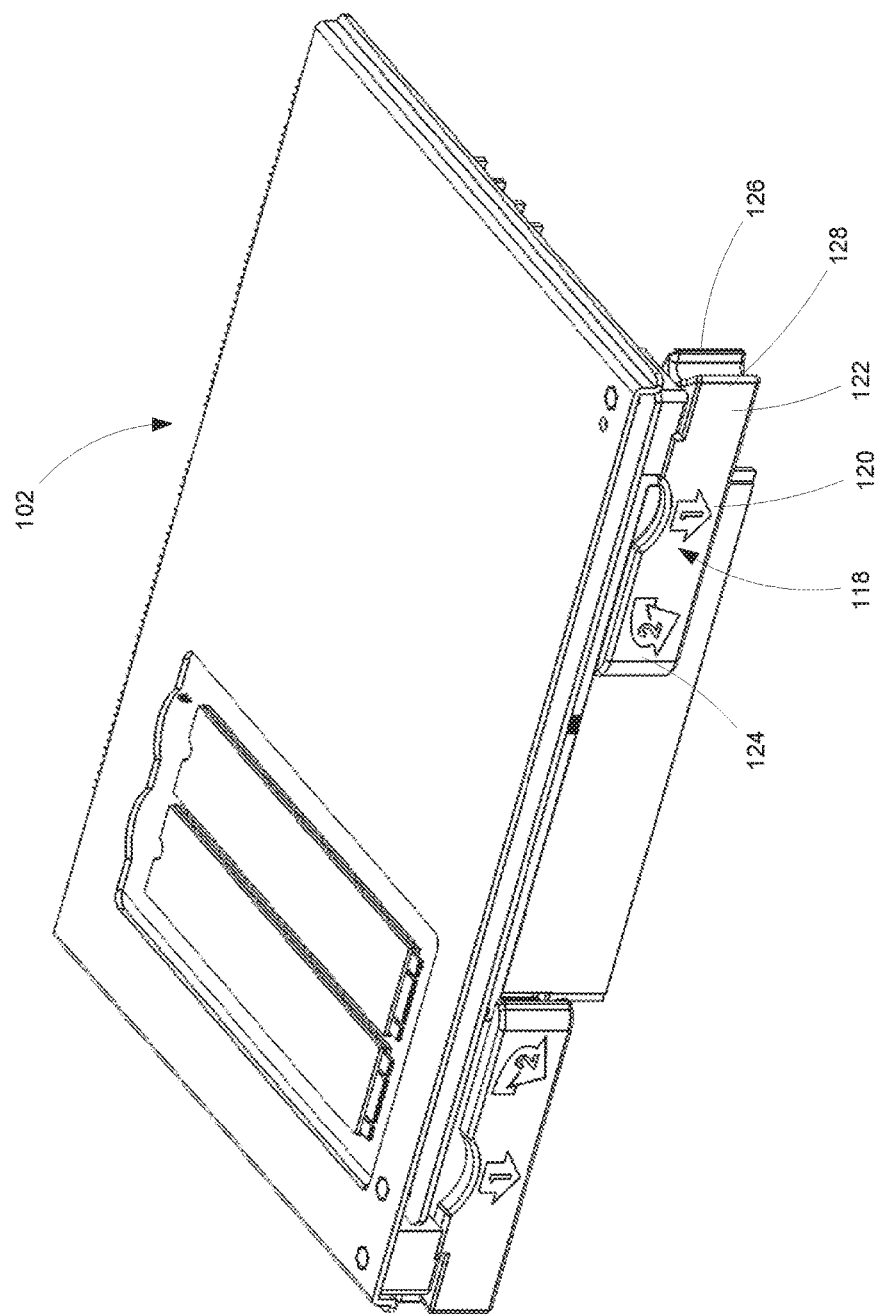
FIG. 2 is an isometric view of the memory drive assembly including self-contained circuit board actuators shown in FIG. 1.

With further reference to FIG. 2, each actuator lever 118 includes an arm 120 extending between first and second end portions 122 and 124, respectively. An insertion pawl 126 extends from the first end portion 122 of the arm 120. An ejector pawl 128 is positioned opposite the insertion pawl 126 on the first end portion 122. The insertion pawls 126 each operate against the first surface 114 of the keeper portions 112 (FIG. 1) to insert the circuit board assembly 102 into the circuit board connector when the pair of levers 118 are moved toward a closed position, which is shown in FIG. 2. The ejector pawls 128 each operate against the second surface 116 of the keeper portions 112 (FIG. 1) to eject the circuit board from the circuit board connector when the pair of levers 118 are moved toward an open position (FIG. 4).

Figure 3:
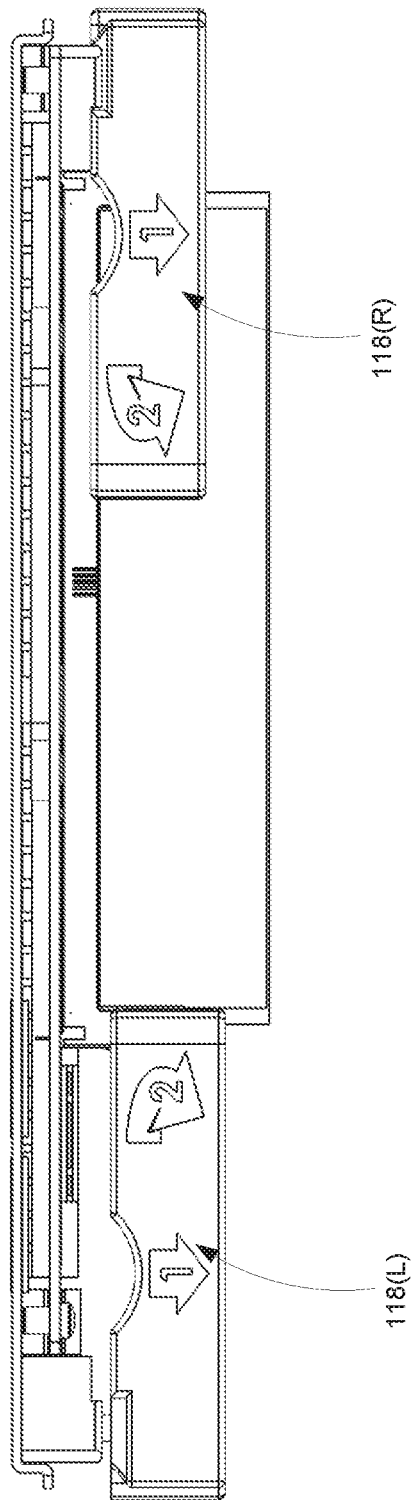
FIG. 3 is a front view in elevation of the self-contained actuators shown in FIGS. 1 and 2.

FIG. 3 illustrates both the left and right actuator levers 118 in the closed position. However, the left actuator lever 118(L) is in an unlatched position, whereas the right actuator lever 118(R) is in the latched positioned. Once the actuator levers 118 are moved to the unlatched position, as discussed in greater detail below, the levers 118 can be moved to the open position, as shown in FIG. 4, in order to eject the circuit board assembly 102 from connectors 130.

Figure 4:
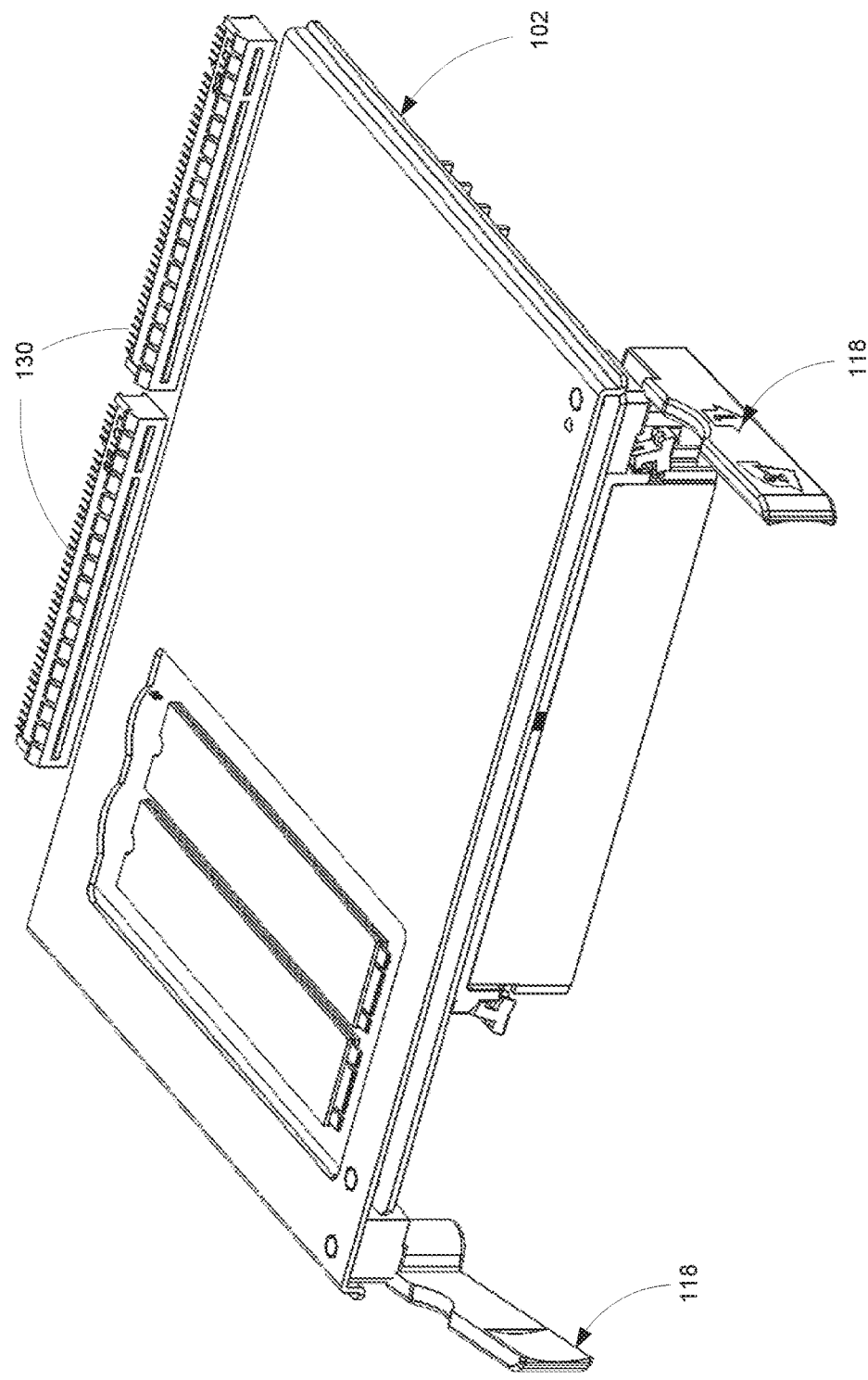
FIG. 4 is an isometric view of the memory drive assembly with the self-contained circuit board actuators in the open position.
Figure 5:
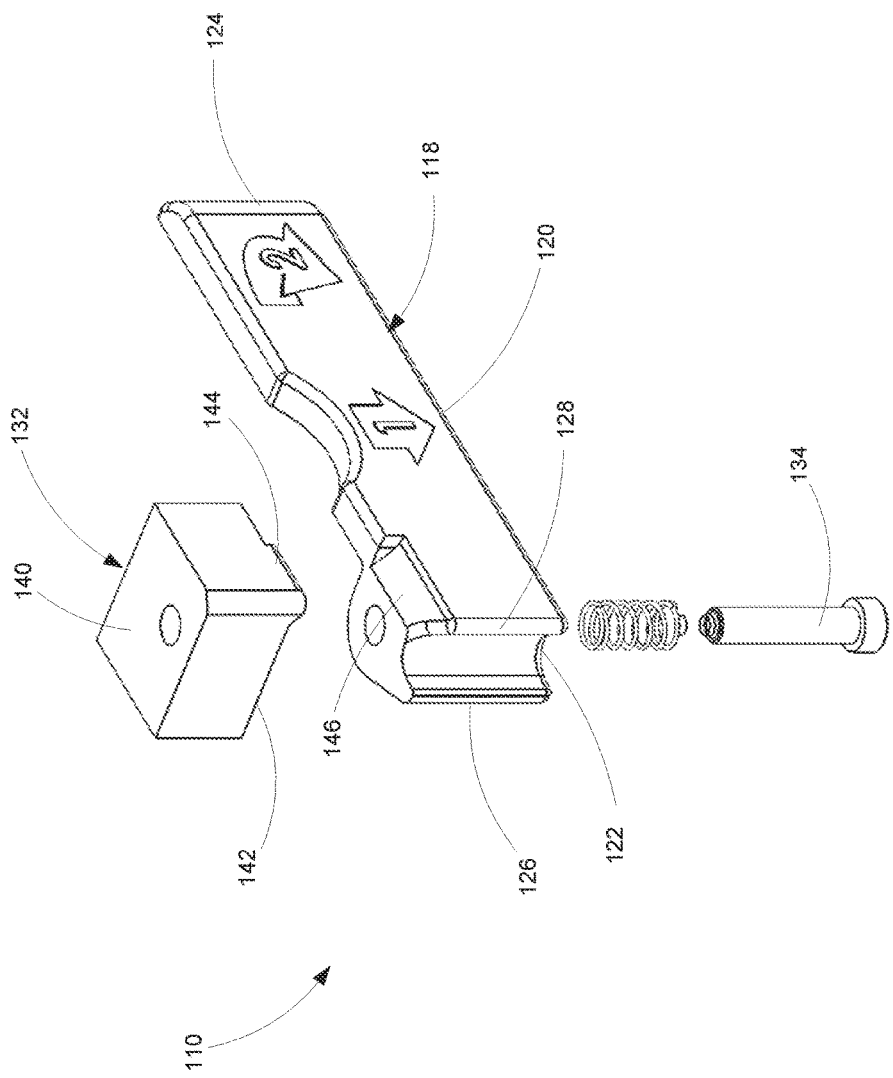
FIG. 5 is an exploded isometric view of the self-contained actuator.

As shown in FIG. 5, the circuit board actuators 110 include a pivot bearing 132 connectable to the circuit board 106 (FIG. 4). In some embodiments, the pivot bearing 132 is connected to the circuit board 106 with a fastener 134. The pivot bearing 132 includes a mounting surface 140 that engages or otherwise supports the circuit board, and a bearing surface 142 opposite the mounting surface 140. A catch tab 144 extends from the bearing surface 142 away from the mounting surface 140. The actuator lever 118 is pivotably coupled to the pivot bearing 132 adjacent the bearing surface 142 and is moveable between the closed and open positions. As explained above, the actuator lever 118 includes arm 120 extending between the first and second end portions 122 and 124. A latch notch 146 is formed in the first end portion 122 adjacent the pair of opposed pawls 126/128 and configured to engage the catch tab 144 on the pivot bearing 132 when the lever 118 is in the closed position, thereby retaining the lever 118 in the closed position.

Figure 6:
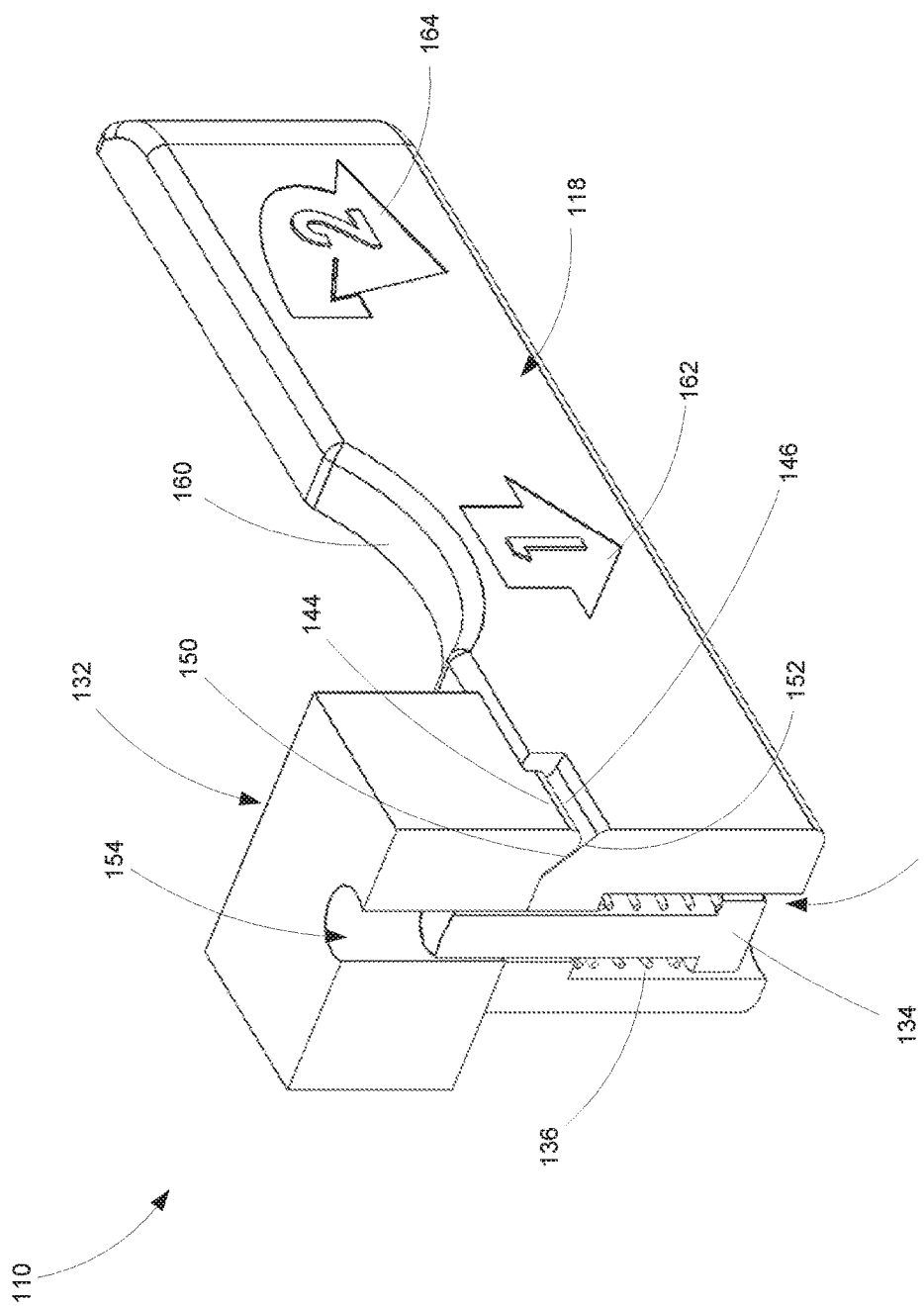
FIG. 6 is an isometric view in cross-section of the self-contained actuator.

As shown in FIG. 6, the actuator lever 118 is pivotably connected to the pivot bearing 132 with a pivot pin or pivot member so as to allow the actuator lever to pivot relative to the pivot bearing 132 between the open and closed positions. In one embodiment, the pivot pin can be the fastener 134 that securely holds the pivot bearing 132 to the circuit board (FIG. 4). In another embodiment, the actuator lever 118 can be connected to the pivot bearing 132 with the pivot pin or other fastener, and different fasteners can be used to securely hold the pivot bearing 132 to the printed circuit board. In the illustrated embodiment, the fastener 134 extends through a pivot bore 156 (e.g., a counterbored through hole) and into a threaded bore 154. Accordingly, the actuator lever 118 can both pivot and slide with respect to the fastener 134. A resilient member, such as a compression spring 136, is positioned in the pivot bore 156 between the fastener 134 and the actuator lever 118. Thus, the compression spring 136 is positioned to urge the actuator lever 118 toward the latched position. The latch notch 146 and the catch tab 144 include cooperative ramped surfaces 150 and 152 operative to urge the actuator lever 118 axially relative to the fastener 134 or other pivot pin and away from the pivot bearing toward the unlatched position when the actuator lever 118 is forcibly pivoted about the fastener 134 or other pivot pin and moved toward the open position.

In some embodiments, the circuit board actuator 110 can include a torsion spring (not shown) positioned between the actuator lever 118 and pivot bearing 132 to urge the lever toward the open position. In some embodiments, the actuator lever 118 includes a relief 160 sized to allow a user to insert a finger or tool over an edge of the actuator lever 118 to facilitate grasping and pivoting the actuator lever 118 between the closed and open positions. In some embodiments, the actuator lever 118 includes indicia 162 and 164 to indicate the steps necessary to unlatch and open the circuit board actuator 110. For example, the indicia 162 indicates a first step where the actuator lever 118 can be unlatched by moving the actuator lever 118 in the direction of the arrow, thereby sliding the actuator lever 118 axially along the fastener 134 to disengage the latch notch 146 from the catch tab 144. The indicia 164 indicates a second step where the actuator lever 118 can be rotated about the fastener 134 away from the closed position in order to move the ejector pawl 128 against the corresponding second surface 116 of the keeper 112 to eject the circuit board as the lever 118 is moved toward the open position (FIG. 2).

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A self-contained circuit board actuator for ejecting and inserting a circuit board into a circuit board connector, comprising:
   a pivot bearing connectable to the circuit board, the pivot bearing including:
      a bearing surface configured to face away from the circuit board; and
      a catch tab extending from the bearing surface; and
   an actuator lever pivotably coupled to the pivot bearing adjacent the bearing surface and moveable between a closed position and an open position, the actuator lever including:
      an arm extending between a first end portion and a second end portion;
      an ejector pawl extending from the first end portion of the arm; and
      a latch notch formed in the first end portion adjacent the ejector pawl and configured to engage the catch tab on the pivot bearing when the actuator lever is in the closed position.

2. The self-contained circuit board actuator of claim 1, wherein the actuator lever further comprises an insertion pawl opposite the ejector pawl.

3. The self-contained circuit board actuator of claim 1, wherein the actuator lever is pivotably coupled to the pivot bearing by a pivot member.

4. The self-contained circuit board actuator of claim 3, wherein the first end portion of the arm includes a pivot bore adapted to receive the pivot member.

5. The self-contained circuit board actuator of claim 4, wherein the actuator lever is slidable axially along the pivot member relative to the pivot bearing between a latched position and an unlatched position.

6. The self-contained circuit board actuator of claim 5, including a resilient member positioned to urge the actuator lever toward the latched position.

7. The self-contained circuit board actuator of claim 3, wherein the pivot member is a fastener.

* * * * *

UNITED STATES PATENT AND TRADEMARK OFFICE
CERTIFICATE OF CORRECTION

PATENT NO. : 10,398,052 B2  
APPLICATION NO. : 15/286241  
DATED : August 27, 2019  
INVENTOR(S) : Jon Brian Ehlen Page 1 of 1

It is certified that error appears in the above-identified patent and that said Letters Patent is hereby corrected as shown below:

On the Title Page

In Column 1, item (73), Assignee, Line 1, delete "Parks," and insert -- Park, --, therefor.

Signed and Sealed this
Twenty-second Day of October, 2019

Andrei Iancu
*Director of the United States Patent and Trademark Office*